(12) United States Patent
Suryagandh et al.

(10) Patent No.: US 8,309,951 B2
(45) Date of Patent: Nov. 13, 2012

(54) TEST STRUCTURE FOR DETERMINING GATE-TO-BODY TUNNELING CURRENT IN A FLOATING BODY FET

(75) Inventors: Sushant S. Suryagandh, Sunnyvale, CA (US); Ciby Thomas Thuruthiyil, Fremont, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 319 days.

(21) Appl. No.: 11/879,937

(22) Filed: Jul. 18, 2007

(65) Prior Publication Data

US 2009/0020754 A1    Jan. 22, 2009

(51) Int. Cl.
*H01L 23/58* (2006.01)

(52) U.S. Cl. .......... 257/40; 257/E21.524; 257/E21.531; 257/E23.179; 348/537; 348/763; 348/765; 348/769

(58) Field of Classification Search .............. 257/48, 257/E21.524, E21.531, E23.179; 324/537, 324/763, 765, 769
See application file for complete search history.

(56) References Cited

U.S. PATENT DOCUMENTS

| | | | |
|---|---|---|---|
| 7,132,683 B1 * | 11/2006 | Krishnan et al. | 257/40 |
| 7,329,578 B2 * | 2/2008 | Wei | 438/257 |
| 2002/0080639 A1 * | 6/2002 | Keeth et al. | 365/51 |

FOREIGN PATENT DOCUMENTS

JP        11-214546     *  6/1999

* cited by examiner

*Primary Examiner* — Eduardo A Rodela
(74) *Attorney, Agent, or Firm* — Farjami & Farjami LLP

(57) ABSTRACT

In one disclosed embodiment, the present test structure for determining gate-to-body current in a floating body FET includes a floating body FET situated over a semiconductor layer, where the floating body FET includes a first gate and first and second source/drain regions. The floating body test structure further includes a second gate and a first contact situated over the first source/drain region. A gate-to-channel current measured between the second gate and the first contact is utilized to determine the gate-to-body tunneling current. The gate-to-body tunneling current can be determined by subtracting the gate-to-channel current from twice a source/drain current of the floating body FET. The test structure may also include a second contact situated on a doped region in the semiconductor layer, where a diode current flow through the doped region determines a body voltage for the floating body FET.

20 Claims, 3 Drawing Sheets

TEST STRUCTURE FOR DETERMINING GATE-TO-BODY TUNNELING CURRENT IN A FLOATING BODY FET

TECHNICAL FIELD

The present invention is generally in the field of semiconductor devices. More particularly, the invention is in the field of transistor design.

BACKGROUND ART

Floating body FETs, for instance silicon-on-insulator (SOI) MOFETS, exhibit different characteristics than bulk silicon devices. Among these differences are notable advantages, including reduced parasitic source/drain capacitance and enhanced performance at higher switching frequencies. Electrical isolation of the transistor body is not without its drawbacks, however. For example, floating body FETs can exhibit hysteresis, in which a particular FET's prior operational state can result in a shift in its threshold voltage. Because these threshold voltage variations are dynamically produced, they can result in undesirable performance instabilities in circuits, such as oscillators, utilizing floating body FETs. One of the most important operational parameters influencing hysteresis in a floating body FET is its gate-to-body tunneling current. As a result, accurate determination of the gate-to-body tunneling current is critical when designing circuits utilizing floating body FETs.

Because a floating body device lacks a body terminal to be accessed for direct measurement, a conventional approach to obtaining an estimate of the gate-to-body tunneling current in a floating body FET includes measuring an analogous gate-to-body tunneling current in a body-tied FET structure. Various layout configurations have been developed in attempts to improve the accuracy of the estimated gate-to-body tunneling current produced by this approach. Nevertheless, data obtained from conventional methods using body-tied devices can produce overestimated approximations of gate-to-body tunneling current in floating body FETs, in some instances by a substantial factor.

SUMMARY

A test structure for determining gate-to-body tunneling current in a floating body FET, substantially as shown in and/or described in connection with at least one of the figures, as set forth more completely in the claims.

DETAILED DESCRIPTION OF THE INVENTION

The present invention is directed to a test structure for determining gate-to-body tunneling current in a floating body FET. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the present invention, which use the principles of the present invention, are not specifically described in the present application and are not specifically illustrated by the present drawings.

Figure 1:
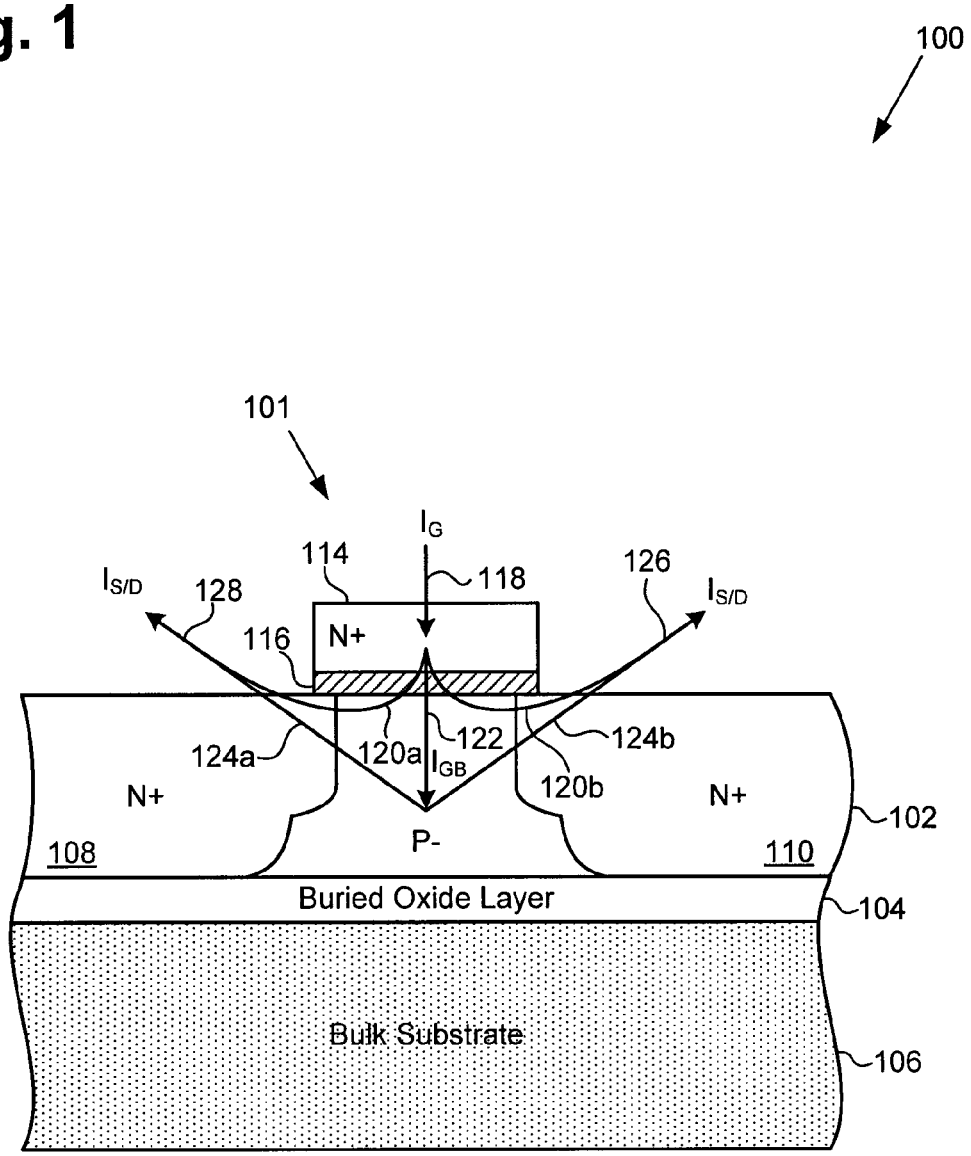
FIG. 1 shows a cross-sectional view of a floating body FET.

FIG. 1 shows a cross-sectional view of a floating body FET. Structure 100, in FIG. 1, shows floating body FET 101, which includes semiconductor layer 102 formed over buried oxide layer 104 deposited on bulk substrate 106. Semiconductor layer 102 can comprise silicon, for example, and includes source/drain region 108 and source/drain region 110. Also shown in FIG. 1, is gate 114, situated over gate oxide layer 116. In structure 100, gate oxide layer 116 can comprise, for example, silicon oxide, and in one embodiment can be a metal oxide. In the present embodiment, source/drain regions 108 and 110 are heavily doped with a suitable N-type dopant, as shown in FIG. 1. Buried oxide layer 104 can be any suitable insulating material, while bulk substrate 106 can, for instance, comprise silicon. As described here and shown in FIG. 1, floating body FET 101 corresponds to a floating body NFET. Floating body FET 101 is merely exemplary, however, and the present invention's test structure may be utilized with any type of floating body FET, including, but not limited to, NFETs, PFETs, MOSFETs, and silicon-on-insulator (SOI) based devices, for example.

Also shown in FIG. 1 are currents flowing from gate 114. Present are gate current 118, comprising gate-to-channel components 120a and 120b and gate-to-body tunneling current 122. Gate-to-body tunneling current 122 further comprises current components 124a and 124b. Also included in FIG. 1 are source/drain currents 126 and 128. As can be seen in FIG. 1, floating body FET 101 is electrically isolated due to the presence of buried oxide layer 104. In addition, floating body FET 101 shows source/drain regions 108 and 110 extending through semiconductor layer 102, to abut buried oxide layer 104. As a result, the current components shown in FIG. 1 obey Kirchoff's current law, so that the sum of the currents flowing into the body of floating body FET 101 equals the sum of the currents flowing out of the body of floating body FET 101.

Bearing in mind, as well, that source/drain currents 126 and 128 are typically substantially equal to one another, it can be seen from FIG. 1 that gate current 118 is divided into gate-to-channel current components 120a and 120b having substantially equal magnitude, and gate-to-body tunneling current 122. Because floating body FET 101 is electrically isolated, it is not possible to measure gate-to-body tunneling current 122 directly. However, structure 100 shows that gate-to-body tunneling current 122 flowing in to the body of floating body FET 101, must be matched by current components flowing outward. Those currents are shown by current components 124a and 124b, each having a magnitude substantially equal to one-half gate-to-body tunneling current 122.

Thus, according to structure 100 in FIG. 1 and the current flow constraints discussed above, the relationship between the influx and outflow of currents from the body of floating body FET 101 can be expressed by the following equation:

$$I_{S/D} = \tfrac{1}{2} I_{GC} + \tfrac{1}{2} I_{GB}$$ (Equation 1);

where $I_{S/D}$ is source/drain current 126 or 128, $\frac{1}{2}I_{GC}$ is gate-to-channel current component 120a or 120b, and $\frac{1}{2}I_{GB}$ is current component 124a or 124b, in FIG. 1.

Consequently, measurement of source/drain current 126 or 128, together with knowledge of the magnitude of the gate-to-channel current, determines gate-to-body tunneling current 122. Source/drain currents 126 and 128 may readily be obtained by direct measurement from source/drain contacts typically present on a floating body FET (not shown on floating body FET 101, in FIG. 1). According to Equations 1 and 2, then, determination of gate-to-body tunneling current in floating body FET 101, requires a means for measuring the gate-to-channel current.

Figure 2:
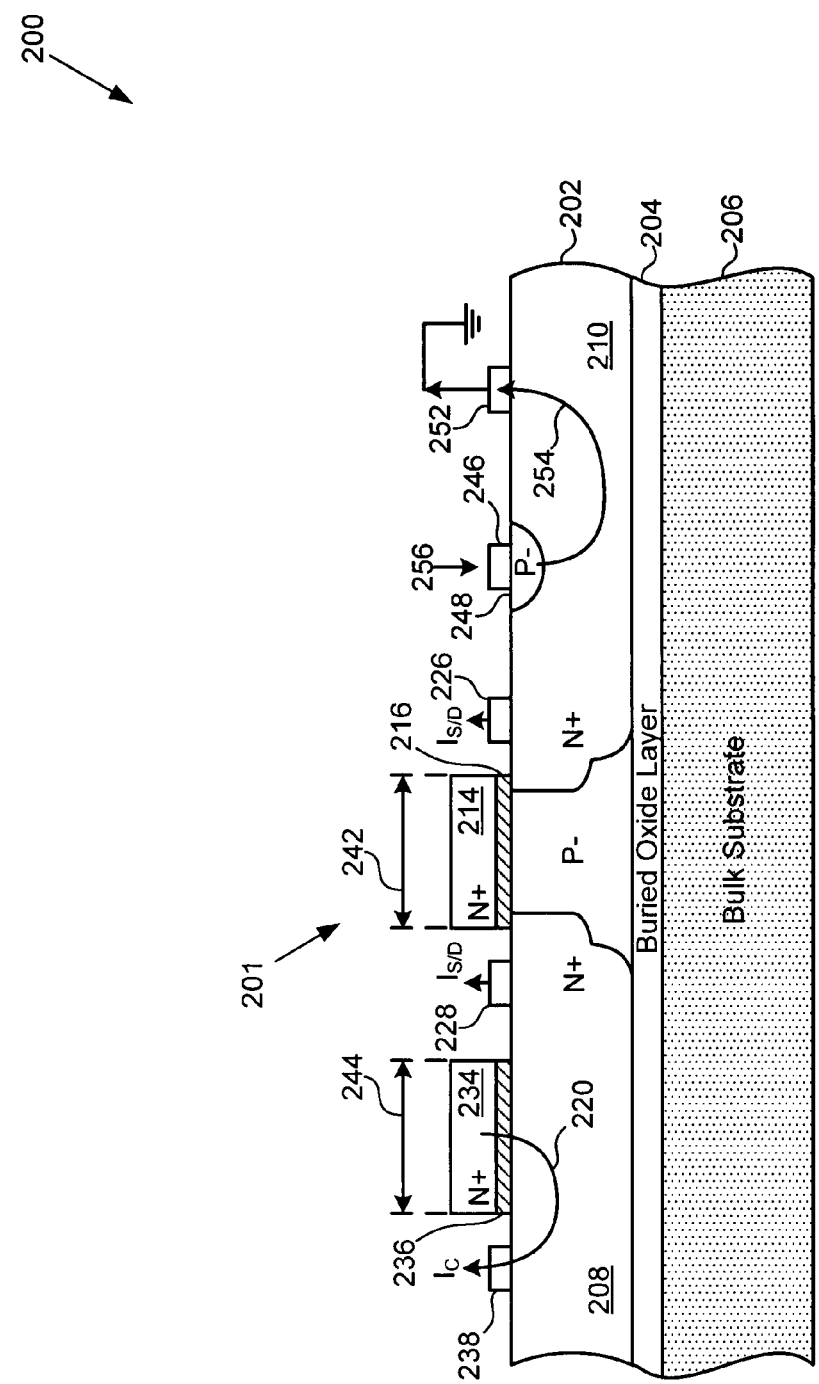
FIG. 2 shows a cross-sectional view of an exemplary floating body test structure, according to one embodiment of the present invention.

FIG. 2 shows a cross-sectional view of an exemplary floating body test structure, according to one embodiment of the present invention. For consistency with the discussion surrounding FIG. 1, the present embodiment shows a test structure for determining gate-to-body tunneling current for a floating body NFET, and is exemplary only. Other embodiments may include other types of floating body FETs, as explained previously.

Test structure 200, in FIG. 2, includes floating body FET 201, corresponding to floating body FET 101 in FIG. 1. Floating body FET 201, in FIG. 2, comprises semiconductor layer 202 formed over buried oxide layer 204 deposited on bulk substrate 206, corresponding respectively to semiconductor layer 102 formed over buried oxide layer 104 deposited on bulk substrate 106, in FIG. 1. As in structure 100, in FIG. 1, semiconductor layer 202 in test structure 200 of FIG. 2 includes source/drain region 208 and source/drain region 210, corresponding to source/drain region 108 and source/drain region 110, in the previous figure. Moreover, test structure 200 also comprises gate 214 situated over semiconductor layer 202, as well as gate oxide layer 216, corresponding to first gate 114 and gate oxide layer 116, in FIG. 1. In addition, FIG. 2 shows source/drain contacts 226 and 228, discussed in conjunction with floating body FET 101, but not shown in FIG. 1.

In addition to floating body FET 201, test structure 200, in FIG. 2, also includes second gate 234 and first contact 238 situated over source/drain region 208, and having no analogue in FIG. 1. It should be noted that although in the present embodiment gate 234 and contact 238 are situated over source/drain region 208, in an alternative embodiment, gate 234 and contact 238 are formed over source/drain region 210. Also shown is gate-to-channel current 220 measured between gate 234 and contact 238, which reproduces the gate-to-channel current represented by gate-to-channel current components 120a and 120b in FIG. 1. Present, as well, in FIG. 2 is gate oxide layer 236, underlying gate 234 which is shown having length 244, corresponding to length 242 of gate 214. In the present embodiment, length 244 is substantially equal to length 242.

FIG. 2 also shows contact 246 situated on doped region 248, which is formed from semiconductor layer 202 so as to substantially match the doping present in the body of floating body FET 201. In addition, FIG. 2 shows ground contact 252 situated on source/drain region 210, adjacent to doped region 248, as well as diode current 254 flowing between doped region 248 and ground contact 252. Voltage 256, measured at contact 246, represents the voltage required to establish diode current 254 at a predetermined level. As was true for the location of gate 234 and contact 236, placement of contact 246, doped region 248, and ground contact 252 on source/drain region 210 is exemplary only. In an alternative embodiment those elements are situated on source/drain region 208. It should also be noted that although in the present embodiment floating body FET 201 is situated between gate 234 and doped region 248, in one embodiment, both gate 234 with contact 238, and doped region 248 with contact 246 and ground contact 252, are formed on source/drain region 208. In yet another embodiment, those elements are all formed on source/drain region 210.

Test structure 200 can be fabricated on a Silicon-On-Insulator (SOI) substrate that includes semiconductor layer 202, buried oxide layer 204, and bulk substrate 206. The SOI substrate can be formed, for example, by SOI substrate 202 can be formed, for example, by thermally growing a layer of silicon oxide on a silicon surface on each of two wafers and pressing the oxidized surfaces of the wafers against each other at a sufficiently high temperature to cause the wafers to bond together. Silicon oxide situated in the bonding plane of the bonded wafers forms a buried oxide layer, i.e. buried oxide layer 204, in the subsequently formed SOI substrate.

Semiconductor layer 202 can be lightly doped with an appropriate P type dopant and a silicon oxide layer and a polysilicon layer can be sequentially deposited over semiconductor layer 202. The silicon oxide layer and the polysilicon layer can each be deposited by utilizing a chemical vapor deposition (CVD) process or other suitable deposition processes. The respective silicon oxide and polysilicon layers can then be appropriately patterned to form gate oxide layer 216 and gate 214 of floating body FET 201. Source/drain regions 208 and 210 can be formed by utilizing an implantation process to heavily dope the portion of semiconductor layer 202 adjacent to gate 214 with an appropriate N type dopant. During the implantation process, gate 214 can also be heavily doped with the N type dopant. Doped region 248 can be formed, for example, by utilizing a suitable mask to prevent a portion of semiconductor layer 202 from being implanted with the N type dopant during formation of source/drain regions 208 and 210.

In the present embodiment, a layer of silicon oxide and a layer of polysilicon can then be sequentially depositing over source/drain region 208 by utilizing a CVD process or other suitable deposition processes. The respective layers of silicon oxide and polysilicon can then be appropriately patterned to form gate oxide layer 236 and gate 234. Gate 234 can be heavily doped with an appropriate N type dopant in a similar manner as gate 214 discussed above. Contacts 238 and 228 can be formed over source/drain region 208, contacts 226 and 252 can be formed over source/drain region 210, and contact 246 can be formed over doped region 246 in a manner known in the art.

In the test structure of FIG. 2, application of a gate voltage at gate 234 substantially equal to a gate voltage at gate 214 results in gate-to-channel current 220 having substantially the same magnitude as the sum of gate-to-channel current components flowing from gate 214 towards, respectively, source/drain region 208 and source/drain region 210 of floating body FET 201, corresponding to gate-to-channel current components 120a and 120b in FIG. 1. Measurement of gate-to-channel current 220, which may be obtained directly at contact 238 of structure 200, together with measurement of the source/drain current at either source/drain contact 226 or 228, determines the gate-to-body tunneling current of floating body FET 201, according to Equation 1. In other words, by making it possible to measure the gate-to-channel current of floating body FET 201, the present invention's test structure permits determination of the gate-to-body tunneling current, which is derived from the directly measurable source/drain currents, and the gate-to-channel current value measured between gate 234 and contact 238. As defined by Equation 1, the gate-to-body tunneling current may be obtained by subtraction of the gate-to-channel current from two times the source/drain current measured at either source/drain contact 226 or 228.

In a subsequent step, the body voltage of floating body FET 201, in FIG. 2, may be obtained as well. From FIG. 1 and the current flow constraints imposed by electrical isolation of the body of FET 101, it can be seen that current components 124*a* and 124*b* are both substantially equal in magnitude to one-half of gate-to-body tunneling current 122. Turning now to FIG. 2, it can be seen that those current component are analogous to diode currents flowing from the body of floating body FET 201 to source/drain regions 208 and 210, each having magnitude substantially equal to one-half the gate-to-body tunneling current flowing into the body of floating body FET 201. Those diode currents may be simulated using diode current 254 flowing from doped region 248 to ground contact 252.

By varying voltage 256 applied at contact 246, diode current 254 can be tuned to a predetermined level. When that level replicates the value of the current component flowing from the body of floating body FET 201 into source/drain region 208 or source/drain region 210, i.e. one-half the gate-to-body tunneling current of floating body FET 201, voltage 256 at contact 246 will be substantially equal to the body voltage of floating body FET 201. Because the magnitude of the gate-to-body tunneling current has been determined from measurement of the gate-to-channel current and Equation 1, the body voltage of floating body FET 201 may be readily obtained by appropriate adjustment of diode current 254. The foregoing steps can be repeated for gate voltages spanning any desired range, providing a relationship between applied gate voltage, gate-to-body tunneling current, and body voltage, which can be used to form a predictive model of hysteresis for floating body FET 201.

Thus, the present invention's test structure makes it possible to determine the gate-to-body tunneling current of a floating body FET, without resorting to the tied-body simulations relied upon in conventional approaches, which are known to provide exaggerated values for that parameter. Because the gate-to-body tunneling current plays an important role in controlling hysteresis in a floating body FET, its determination, made possible by the present invention's test structure, advantageously enables more accurate prediction of hysteresis in those devices. That, in turn, renders circuit design more efficient, and the electronic systems utilizing those floating body devices more reliable.

Figure 3:
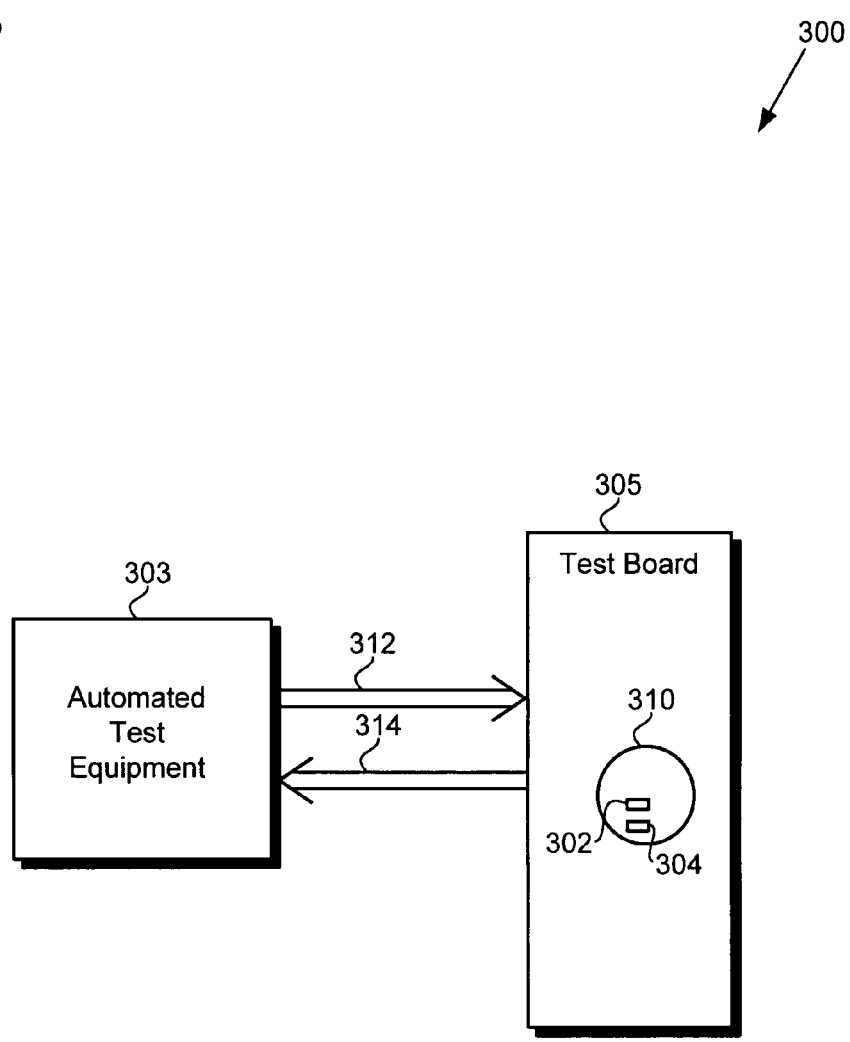
FIG. 3 shows an exemplary test system including an exemplary test structure in accordance with one embodiment of the present invention.

FIG. 3 shows an embodiment of the invention utilized in a test system for determining gate-to-body tunneling current in a floating body FET. Such a system might be utilized during circuit design in order to predict hysteresis in the floating body FET, for example. FIG. 3 shows an exemplary test system including an exemplary wafer under test and multiple exemplary floating body test structures, in accordance with one embodiment of the present invention. Test system 300 includes automated (i.e. computerized) test equipment 303 and test board 305. Test board 305 includes wafer under test 310, which can include test structures 302 and 304. Wafer under test 310 can also include additional test structures (not shown in FIG. 3), which are similar to test structures 302 and 304.

As shown in FIG. 3, test board 305 is coupled to automated test equipment 303 by buses 312 and 314. Test board 305 can include a number of interconnect traces (not shown in FIG. 3) to couple signals to and from automated test equipment 303 to the appropriate contact points or pads on each test structure on wafer under test 310. In the present embodiment, wafer under test 310 is mounted on test board 305. In an alternative embodiment, wafer under test 310 may not be mounted on test board 305, and may be connected directly to automated test equipment 303 via a number of probes and buses 312 and 314.

Automated test equipment 303 is configured to apply a suitable voltage to, for example, gate 234 of test structure 200, in FIG. 2, and to measure current at, for example, source/drain contact 226 or 228, of test structure 200. Automated test equipment 303 is also configured to measure the floating body voltage simulated at contact 246 of test structure 200. As such, automated test equipment 303 can be utilized to determine gate-to-body tunneling current, to determine body voltage, and to more accurately predict hysteresis, in a floating body FET.

Thus, the present invention's test structure for determining gate-to-body tunneling current in a floating body FET advantageously determines that current in a floating body device, without recourse to a body-tied simulation, with its attendant inaccurate results. By providing a measurement of gate-to-channel current in a floating body FET, the present structure makes it possible to derive a value for the gate-to-body tunneling current by subtracting the gate-to-channel current from two times a source/drain current measured directly from a source/drain contact on the floating body FET itself. The gate-to-body tunneling current so derived, may then be used to obtain a body voltage, and to form a predictive model of hysteresis in the floating body FET. As a result, circuits and systems designed according to data provided by the present invention's test structure may be more stable and more reliable than those based on estimates of gate-to-body tunneling current provided by conventional body-tied simulations. Moreover, it is manifest from the above description of the present invention that various embodiments of the invention can be utilized to measure gate-to-body tunneling currents, and that result of such measurements can be employed to fabricate, for example, improved production field effect transistors, which are in turn used in fabrication of one or more production chips with improved characteristics and performance.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, a test structure for determining gate-to-body tunneling current in a floating body FET has been described.

The invention claimed is:

1. A floating body test structure for determining gate-to-body tunneling current, said floating body test structure comprising:

a floating body FET situated over a semiconductor layer, said floating body FET including a first gate and first and second source/drain regions;

a second gate and a first contact situated over said first source/drain region;

wherein said floating body test structure is configured such that a gate-to-channel current between said second gate and said first contact indicates said gate-to-body tunneling current in said floating body FET; and wherein said first gate and said second gate comprise separate structures that are laterally spaced apart and do not overlap.

2. The floating body test structure of claim 1 further comprising a doped region formed in said first source/drain region of said floating body FET, wherein said doped region and said first source/drain region form a diode for determining a body voltage of said floating body FET.

3. The floating body test structure of claim 2 wherein said body voltage of said floating body FET is determined by causing a current to flow through said diode.

4. The floating body test structure of claim 1 wherein said gate-to-body tunneling current is determined by using a source/drain current of said floating body FET.

5. The floating body test structure of claim 1 further comprising a doped region formed in said second source/drain region of said floating body FET, wherein said doped region and said second source/drain region form a diode for determining a body voltage of said floating body FET.

6. The floating body test structure of claim 5 wherein said body voltage of said floating body FET is determined by causing a current to flow through said diode.

7. The floating body test structure of claim 1 wherein a length of said first gate is substantially equal to a length of said second gate.

8. The floating body test structure of claim 1 wherein said floating body FET is a silicon-on-insulator (SOI) MOSFET.

9. The floating body test structure of claim 1 wherein said floating body FET is an NFET.

10. The floating body test structure of claim 1 wherein said floating body test structure is utilized to measure said gate-to-body tunneling current.

11. The floating body test structure of claim 10 wherein said gate-to-body tunneling current is utilized to fabricate production field effect transistors.

12. The floating body test structure of claim 11 wherein said production field effect transistors are utilized to fabricate one or more production chips.

13. A floating body test structure for determining gate-to-body tunneling current and body voltage, said floating body test structure comprising:

a floating body FET situated over a semiconductor layer, said floating body FET including a first gate and first and second source/drain regions;

a second gate and a first contact situated over said first source/drain region;

a doped region situated in said semiconductor layer;

wherein said floating body test structure is configured such that a gate-to-channel current measured between said second gate and said first contact indicates said gate-to-body tunneling current, and said body voltage can be determined by causing a diode current to flow through said doped region; and wherein said first gate and said second gate comprise separate structures that are laterally spaced apart and do not overlap.

14. The floating body test structure of claim 13 wherein said gate-to-body tunneling current is determined by using a source/drain current of said floating body FET.

15. The floating body test structure of claim 13 wherein said doped region is situated in said first source/drain region.

16. The floating body test structure of claim 13 wherein said doped region is situated in said second source/drain region.

17. The floating body test structure of claim 13 wherein said floating body FET is a silicon-on-insulator (SOD MOSFET.

18. A test system comprising at least one floating body test structure for determining gate-to-body tunneling current, said at least one floating body test structure comprising:

a floating body FET situated over a semiconductor layer, said floating body FET including a first gate and first and second source/drain regions;

a second gate and a first contact situated over said first source/drain region;

wherein said floating body test structure is configured such that a gate-to-channel current measured between said second gate and said first contact is utilized to determine said gate-to-body tunneling current in said floating body FET; and wherein said first gate and said second gate comprise separate structures that are laterally spaced apart and do not overlap.

19. The test system of claim 18 wherein said gate-to-body tunneling current is determined by subtracting said gate-to-channel current from approximately twice a source/drain current of said floating body FET.

20. The test system of claim 18 wherein said floating body FET is a silicon-on-insulator (SOI) MOSFET.

* * * * *